United States Patent
Mun et al.

(10) Patent No.: US 11,086,745 B2
(45) Date of Patent: Aug. 10, 2021

(54) MEMORY SYSTEM INCLUDING A PLURALITY OF CONTROLLERS

(71) Applicant: SAMSUNG ELECTRONICS CO., LTD., Suwon-si (KR)

(72) Inventors: Kui-Yon Mun, Hwaseong-si (KR);
Jae-Yong Jeong, Hwaseong-si (KR);
Sung-Kyu Park, Seoul (KR);
Beomkyu Shin, Seongnam-si (KR);
Young-Seok Hong, Hwaseong-si (KR)

(73) Assignee: SAMSUNG ELECTRONICS CO., LTD., Suwon-si ( * ) Notice: Subject to any disclaimer, the term of this patent is extended or adjusted under 35 U.S.C. 154(b) by 0 days.

(21) Appl. No.: 16/573,101

(22) Filed: Sep. 17, 2019

(65) Prior Publication Data
US 2020/0241989 A1    Jul. 30, 2020

(30) Foreign Application Priority Data

Jan. 24, 2019  (KR) ........................ 10-2019-0009242

(51) Int. Cl.
| | | |
|---|---|---|
| G11C 8/00 | (2006.01) | |
| G06F 11/30 | (2006.01) | |
| G06F 11/10 | (2006.01) | |
| G06F 13/16 | (2006.01) | |
| G11C 11/16 | (2006.01) | |
| G06F 12/02 | (2006.01) | |

(52) U.S. Cl.
CPC ...... *G06F 11/3037* (2013.01); *G06F 11/1012* (2013.01); *G06F 11/3058* (2013.01); *G06F 12/0246* (2013.01); *G06F 13/1673* (2013.01); *G11C 11/1653* (2013.01); *G11C 11/1673* (2013.01); *G11C 11/1693* (2013.01); *G06F 2212/7201* (2013.01)

(58) Field of Classification Search
CPC .......... G11C 8/12; G11C 7/18; G11C 7/1006; G11C 5/025; G11C 7/10
USPC .................................................... 365/230.03
See application file for complete search history.

(56) References Cited

U.S. PATENT DOCUMENTS

| | | | |
|---|---|---|---|
| 6,484,270 B1 | 11/2002 | Odani | |
| 7,245,527 B2 | 7/2007 | Qureshi et al. | |
| 7,610,445 B1 | 10/2009 | Manus et al. | |
| 7,958,288 B2 | 6/2011 | Tanaka | |
| 8,131,912 B2 | 3/2012 | Ozawa et al. | |
| 8,706,978 B2 | 4/2014 | Tanaka | |
| 9,131,537 B2 | 9/2015 | Broders et al. | |
| 9,207,949 B2 | 12/2015 | Lee et al. | |
| 2011/0060872 A1 | 3/2011 | Tanaka | |
| 2011/0228595 A1* | 9/2011 | Rao .......................... | G11C 8/16 365/158 |
| 2015/0046664 A1* | 2/2015 | Fitzpatrick ............ | G06F 3/0616 711/156 |

(Continued)

*Primary Examiner* — Son T Dinh
(74) *Attorney, Agent, or Firm* — F. Chau. & Associates, LLC

(57) ABSTRACT

A memory system includes a memory device, a first controller, and a second controller. The first controller is configured to output a control signal for the memory device and data to be stored in the memory device based on a signal received from a host. The second controller includes a non-volatile memory configured to store the data. The second controller is configured to receive the control signal and the data from the first controller, and control the memory device based on the control signal.

19 Claims, 18 Drawing Sheets

(56) References Cited

U.S. PATENT DOCUMENTS

2016/0117105 A1* 4/2016 Thangaraj ............. G06F 3/0625
  711/103
2016/0224419 A1* 8/2016 Takai .................. G06F 11/1048
2018/0165198 A1   6/2018 Liu

* cited by examiner

MEMORY SYSTEM INCLUDING A PLURALITY OF CONTROLLERS

CROSS-REFERENCE TO RELATED APPLICATION

This U.S. non-provisional patent application claims the benefit of priority to Korean Patent Application No. 10-2019-0009242, filed on Jan. 24, 2019, in the Korean Intellectual Property Office, the disclosure of which is incorporated by reference in its entirety herein.

BACKGROUND

1. Technical Field

The inventive concept relates to a memory system, and more particularly, to a memory system including a plurality of controllers.

2. Discussion of Related Art

An information communication device typically includes a processor and a memory device. However, the capacity of the memory device may need to be large and the memory device may need to be highly integrated in order for the information communication device to support multiple functions. As the sizes of memory cells of the memory device are reduced in order to increase the degree of integration of the memory device, operation circuits and/or wiring lines included in the memory device for an operation and electrical connection of the memory device become more complicated.

SUMMARY

At least one embodiment of the inventive concept provides a memory controller and a memory system, and more particularly, a memory system including a plurality of memory controllers and a memory device.

According to an exemplary embodiment of the inventive concept, there is provided a memory system including a memory device, a first controller, and a second controller. The first controller is configured to output a control signal for the memory device and data to be stored in the memory device based on a signal received from a host. The second controller includes a non-volatile memory configured to store the data. The second controller is configured to receive the control signal and the data from the first controller, and control the memory device based on the control signal.

According to an exemplary embodiment of the inventive concept, there is provided a memory system including a memory device, a first controller, a second controller, and a non-volatile memory. The first controller is configured to output a control signal for the memory device and data to be stored in the memory device based on a signal received from a host. The second controller includes a first memory interface configured to receive the data from the first controller and a second memory interface configured to output the data to the memory device. The non-volatile memory is configured to receive the data from the second controller and to store the data.

According to an exemplary embodiment of the inventive concept, there is provided a memory controller including a first memory interface, a second memory interface, a non-volatile memory, and a scheduler. The first memory interface is configured to receive a plurality of commands for a memory device and data to be stored in the memory device from a first controller. The second memory interface is electrically connected to the memory device. The non-volatile memory is configured to buffer the data. The scheduler is configured to output data stored in the non-volatile memory and the plurality of commands to the memory device through the second memory interface based on a set schedule.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EXEMPLARY EMBODIMENTS

Hereinafter, an embodiment of the inventive concept will be described in detail with reference to the accompanying drawings.

Figure 1:
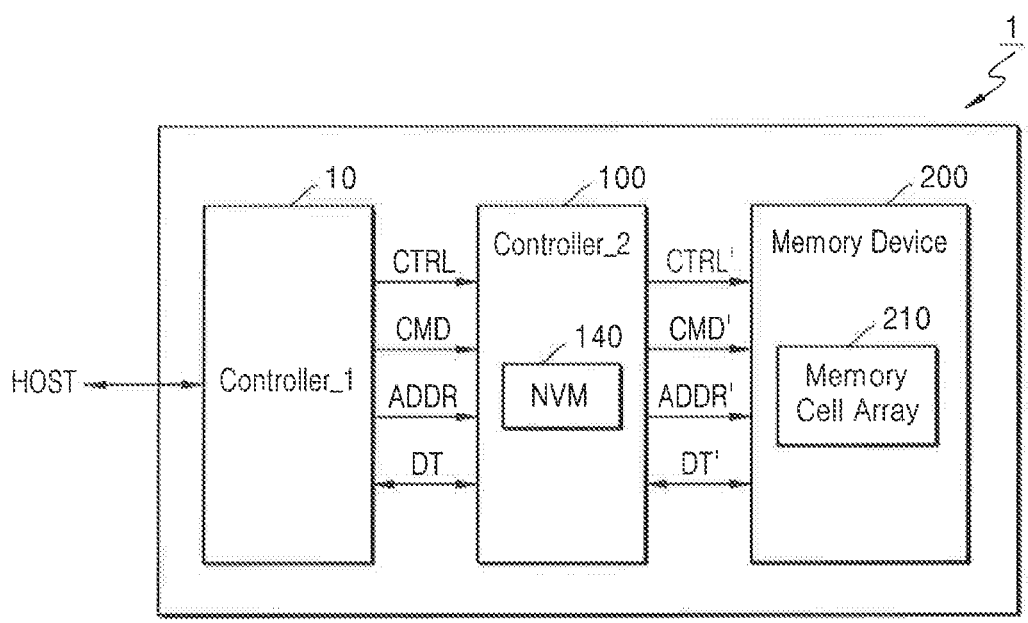
FIG. 1 is a block diagram illustrating a memory system according to an exemplary embodiment of the inventive concept.

FIG. 1 is a block diagram illustrating a memory system 1 according to an exemplary embodiment of the inventive concept.

Referring to FIG. 1, the memory system 1 includes a first controller 10 (e.g., a control circuit), a second controller 100 (e.g., a control circuit), and a memory device 200. The memory device 200 includes a memory cell array 210 and may further include circuits for performing write and read operations on the memory cell array 210 in accordance with control of the first controller 10. For example, when the memory cell array 210 includes flash memory cells, the memory device 200 may be referred to as a flash memory device and the memory system 1 may be referred to as a flash memory system, as an example. However, the inventive concept is not limited to flash memory devices.

According to an exemplary embodiment, the memory cell array 210 includes a two-dimensional (2D) memory cell array implemented by NAND flash memory having a 2D horizontal structure. According to another exemplary embodiment, the memory cell array 210 includes a three-dimensional (3D) memory cell array implemented by NAND flash memory having a 3D vertical structure. The 3D memory cell array is monolithically formed in an active region arranged on a silicon substrate and at at least one physical level of memory cell arrays having a circuit formed on the silicon substrate or in the silicon substrate as a circuit related to operations of memory cells. The term "monolithic" means that layers of each level that configures the 3D memory cell array are stacked on layers of each lower level in the memory cell array.

In an embodiment according to the inventive concept, the 3D memory cell array has a vertical-directional characteristic, and may include vertical NAND strings in which at least one memory cell is located on another memory cell. The at least one memory cell may include a charge trap layer. Each vertical NAND string may include at least one select transistor located over memory cells. The at least one select transistor having the same structure with the memory cells and being formed monolithically together with the memory cells.

The following patent documents, which are hereby incorporated by reference, describe suitable configurations for three-dimensional memory arrays, in which the three-dimensional memory array may be configured as a plurality of levels, with word lines and/or bit lines shared between levels: U.S. Pat. Nos. 7,679,133, 8,553,466, 8,654,587, and 8,559,235 and U.S. Patent Publication No. 2011/0233648.

The first controller 10 outputs various signals for controlling the memory device 200 to write data in the memory device 200 or to read data stored in the memory device 200 in response to write/read requests from a host HOST (e.g., a host device). In an exemplary embodiment, the first controller 10 provides an address ADDR, a command CMD, and a control signal CTRL to the second controller 100 in order to control a program (or write) operation, a read operation, and an erase operation for the memory device 200. For example, when memory cells are arranged in rows and columns in the memory cell array 210, the address ADDR may include a row address and a column address.

In an exemplary embodiment, the first controller 10 provides data DT to be written in the memory device 200 to the second controller 100. For example, the data DT to be written in the memory device 200 may be received from the host HOST or may be generated by the first controller 10. In addition, the first controller 10 may receive the data DT read by the memory device 200 through the second controller 100.

In an exemplary embodiment, the first controller 10 provides the data DT obtained by performing error correction code (ECC) encoding on the data received from the host HOST or the data generated by the first controller 10 to the memory device 200 through the second controller 100. In addition, the first controller 10 may perform ECC decoding on the data DT transmitted through the second controller 100. For example, the first controller 10 may perform an ECC encoding operation on unencoded data it receives from the host HOST to generate encoded data for storage in the memory device 200. For example, the first controller 10 may receive first unencoded data from the host HOST, perform an operation on the first unencoded data to generate second unencoded data, and perform the ECC encoding operation on the second unencoded data to generate encoded data for storage in the memory device 200. For example, the second controller 100 may retrieve encoded data from the memory device 200, output the encoded data to the first controller 100, and the first controller 100 may perform an ECC decoding operation on encoded data.

Although not shown in FIG. 1, the first controller 10 may further include random access memory (RAM), a processor, a host interface (e.g., a host interface circuit), and a memory interface (e.g., memory interface circuit). The RAM may be used as operation memory of the processor, and the processor may control an operation of the first controller 10. The host interface may include a protocol for exchanging data between the host HOST and the first controller 10. In addition, the memory interface may include a protocol for exchanging data between the first controller 10 and the second controller 100.

In addition, although not shown, the first controller 10 may further include a flash translation layer (FTL). In an exemplary embodiment, the first controller 10 converts a logical address received from the host HOST through the FTL into a physical address. Therefore, the first controller 10 provides the physical address to the second controller 100 and the second controller 100 accesses the memory device 200 based on the physical address.

The second controller 100 may control the memory device 200 based on various signals received from the first controller 10. In an exemplary embodiment, the second controller 100 outputs an address ADDR', a command CMD', and a control signal CTRL' to the memory device 200 based on the signals received from the first controller 10. For example, the address ADDR', the command CMD', and the control signal CTRL' that are output from the second controller 100 to the memory device 200 may be respectively the same as the address ADDR, the command CMD, and the control signal CTRL that are output from the first controller 10 to the second controller 100. That is, the second controller 100 may transmit the various signals received from the first controller 10 to the memory device 200.

The second controller 100 includes a non-volatile memory 140. The non-volatile memory 140 may include a plurality of memory cells each having a state corresponding to stored data. The non-volatile memory 140 includes non-volatile memory cells that maintain the stored data even when a power supply is blocked. For example, the non-volatile memory 140 may be electrically erasable programmable read-only memory (EEPROM), flash memory, phase change random access memory (PRAM), resistance RAM (RRAM), nano-floating gate memory (NFGM), polymer RAM (PoRAM), magnetic RAM (MRAM), or ferroelectric RAM (FRAM).

In an exemplary embodiment, the second controller 100 stores the data DT received from the first controller 10 in the non-volatile memory 140. The data DT may be stored in the memory device 200. That is, the non-volatile memory 140 may function as a buffer for the data to be stored in the memory device 200. For example, the data DT may be stored in the non-volatile memory 140 during a first time period and then moved from the non-volatile memory 140 to the memory device 200 during a second time period after the first time period. For example, if power is lost after the data DT has been written to the non-volatile memory 140, after power is restored, it can be moved from the non-volatile memory 140 to the memory device 200. For example, the first controller 10 outputs the command CMD for instructing the data DT to be stored in the non-volatile memory 140 and the second controller 100 stores the data DT in the non-volatile memory 140 in response to the command CMD. Therefore, the first controller 10 may directly access the non-volatile memory 140.

In another example, the first controller 10 outputs the command CMD for instructing the data DT to be stored in the memory device 200 and the second controller 100 stores the data DT in the non-volatile memory 140 in response to the command CMD. Therefore, the first controller 10 may access the non-volatile memory 140 through the second controller 100 instead of directly accessing the non-volatile memory 140. For example, even though a host has requested that the data DT be stored in the memory device 200, the second controller 100 can ignore this request and instead store the data in the non-volatile memory 140.

In an exemplary embodiment, the second controller 100 outputs data DY to the memory device 200 based on the data DT stored in the non-volatile memory 140. For example, the data DT output from the first controller 10 and stored in the non-volatile memory 140 may be the same as the data DT' output from the second controller 100. For example, the second controller 100 may directly transmit the data DT received from the first controller 10 to the memory device 200. In another example, the second controller 100 performs ECC encoding for the non-volatile memory 140 on the data DT received from the first controller 10, stores the data DT in the non-volatile memory 140, and outputs the data DY obtained by performing the ECC decoding on the data DT stored in the non-volatile memory 140 in accordance with previously set scheduling to the memory device 200. For example, the second controller 100 can receive unencoded data from the first controller 10, perform an ECC encoding operation on the received unencoded data to generated encoded data, temporarily store the encoded data in the non-volatile memory 140, and then later retrieve the encoded data from the non-volatile memory 140, and store the retrieved encoded code in the memory device 200.

In an exemplary embodiment, the first controller 10, the second controller 100, and the memory device 200 are implemented by separate semiconductor devices. Alternatively, the first controller 10, the second controller 100, and the memory device 200 may be integrated into one semiconductor device. For example, the first controller 10, the second controller 100, and the memory device 200 may be integrated into one semiconductor device to realize a memory card. For example, the first controller 10, the second controller 100, and the memory device 200 may be integrated into one semiconductor device to realize a PC card, for example, a (personal computer memory card international association) PCMCIA card, a compact flash (CF) card, a smart media (SM) card, a memory stick, a multimedia card (MMC), a reduced size-multi-media card (RS-MMC), or an MMCmicro card, a secure digital (SD) card, a miniSD card, or a microSD card, or a universal flash storage (UFS) card. In another example, the first controller 10, the second controller 100, and the memory device 200 are integrated into one semiconductor device to realize a solid state disk/drive (SSD).

In an alternative embodiment, the first controller 10 and the second controller 100 are integrated into one semiconductor device and the memory device 200 is implemented by an additional semiconductor device. The first controller 10 and the second controller 100 may be connected to each other by, for example, an interconnector or an interposer and may be implemented as a semiconductor module.

Figure 2:
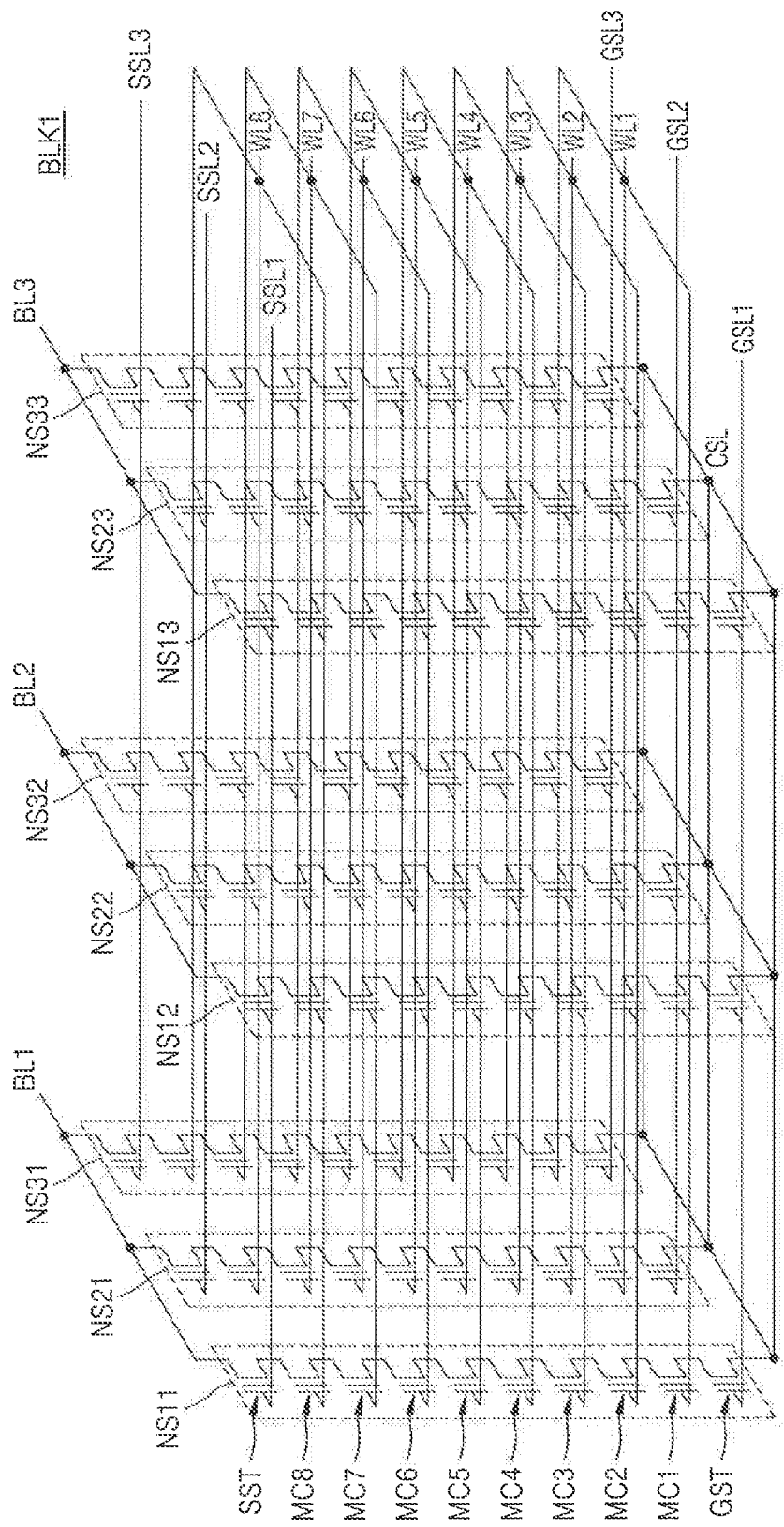
FIG. 2 is a circuit diagram illustrating an example of an equivalent circuit of a memory block included in a memory cell array of FIG. 1.

FIG. 2 is a circuit diagram illustrating an example of an equivalent circuit of a memory block included in a memory cell array 210 of FIG. 1.

Referring to FIG. 2, a memory block BLK1 may be a NAND flash memory having a vertical structure and the memory cell array 210 of FIG. 1 may include a plurality of memory blocks having the same shape as the memory block BLK1. The memory block BLK1 may include a plurality of NAND cell strings NS11 to NS33, a plurality of word lines WL1 to WL8, a plurality of bit lines BL1 to BL3, a plurality of ground selection lines GSL1 to GSL3, a plurality of string selection lines SSL1 to SSL3, and a common source line CSL. Here, the number of NAND cell strings, the number of word lines, the number of bit lines, the number of ground selection lines, and the number of string selection lines may vary in accordance with an embodiment.

The NAND cell strings NS11, NS21, and NS31 are provided between the first bit line BL1 and the common source line CSL. The NAND cell strings NS12, NS22, and NS32 are provided between the second bit line BL2 and the common source line CSL. The NAND cell strings NS13, NS23, and NS33 are provided between the third bit line BL3 and the common source line CSL. Each NAND cell string (for example, NS11) may include a string selection transistor SST, a plurality of memory cells MC1 to MC8, and a ground selection transistor GST that are serially connected.

NAND cell strings commonly connected to one bit line may configure one column. For example, the NAND cell strings NS11, NS21, and NS31 commonly connected to the first bit line BL1 may correspond to a first column, the NAND cell strings NS12, NS22, and NS32 commonly connected to the second bit line BL2 may correspond to a second column, and the NAND cell strings NS13, NS23, and NS33 commonly connected to the third bit line BL3 may correspond to a third column.

NAND cell strings connected to one string selection line may configure one row. For example, the NAND cell strings NS11, NS12, and NS13 connected to the first string selection line SSL1 may correspond to a first row, the NAND cell strings NS21, NS22, and NS23 connected to the second string selection line SSL2 may correspond to a second row, and the NAND cell strings NS31, NS32, and NS33 connected to the third string selection line SSL3 may correspond to a third row.

The string selection transistor SST may be connected to the corresponding string selection lines SSL1 to SSL3. The plurality of memory cells MC1 to MC8 may be respectively connected to the corresponding word lines WL1 to WL8. The ground selection transistor GST may be connected to the corresponding ground selection lines GSL1 to GSL3.

The string selection transistor SST may be connected to the corresponding bit lines BL1 to BL3. The ground selection transistor GST may be connected to the common source line CSL.

In the current embodiment, each word line (for example, WL1) having the same height is commonly connected, the string selection lines SSL1 to SSL3 are separate from each other, and the ground selection lines GSL1 to GSL3 are separate from each other. For example, when memory cells included in the NAND cell strings NS11, NS12, and NS13 connected to the first word line WL1 and corresponding to the first column are programmed, the first word line WL1 and the first string selection line SSL1 are selected. However, the inventive concept is not limited thereto. In another embodiment, the ground selection lines GSL1 to GSL3 may be commonly connected.

In an embodiment, each memory cell included in the memory block BLK1 is be a single level cell (SLC) for storing 1-bit data. In another embodiment, each memory cell included in the memory block BLK1 may be a multilevel cell (MLC) for storing data of no less than 2 bits. For example, each memory cell included in the memory block BLK1 may be a triple level cell (TLC) for storing 3-bit data or a quadruple level cell (QLC) for storing 4-bit data.

Figure 3:
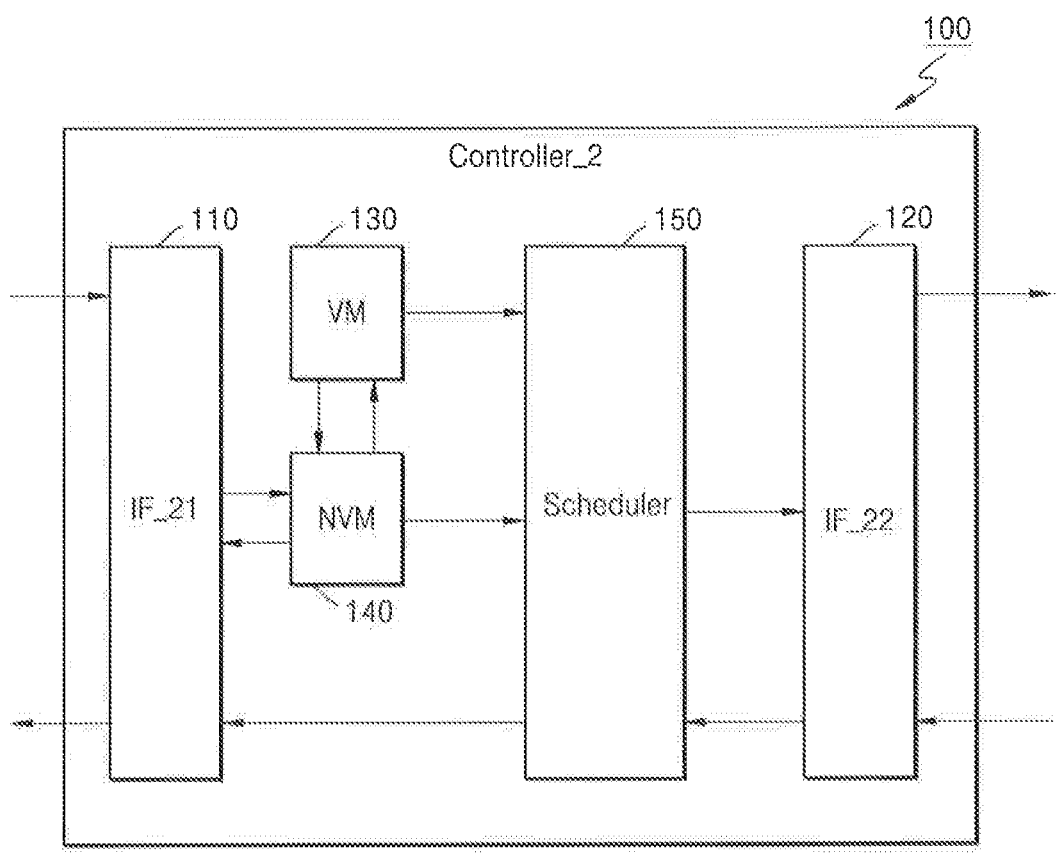
FIG. 3 is a block diagram illustrating a detailed configuration of a second controller according to an exemplary embodiment of the inventive concept.

FIG. 3 is a block diagram illustrating a detailed configuration of a second controller 100 according to an exemplary embodiment of the inventive concept. For example, FIG. 3 may be a block diagram of the second controller 100 of FIG. 1.

Referring to FIG. 3, the second controller 100 includes a first memory interface 110 (e.g., an interface circuit), a second memory interface 120 (e.g., an interface circuit), a volatile memory 130, a non-volatile memory 140, and a scheduler 150. Although not shown, the second controller 100 may further include a processor for controlling an operation of the second controller 100 and random access memory (RAM) used as operation memory of the processor.

The first memory interface 110 may include a protocol for exchanging various signals and data between the first controller 10 and the second controller 100. The second memory interface 120 may include a protocol for exchanging various signals and data between the second controller 100 and the memory device 200. For example, each of the first and second memory interfaces 110 and 120 may communicate with the first controller 10 and the memory device 200 through at least one of various interface protocols such as a universal serial bus (USB), a multimedia card (MMC), peripheral component interconnect-express (PCI-E), advanced technology attachment (ATA), serial-ATA, parallel-ATA, small computer system interface (SCSI), enhanced small drive interface (ESDI), and integrated drive electronics (IDE).

The non-volatile memory 140 may store the data DT received from the first controller 10 through the first memory interface 110. That is, the non-volatile memory 140 may buffer the data DT to be stored in the memory device 200. The data DT may be host data HD received from the host or data generated by the first controller 10. For example, the data DT may be obtained by the first controller 10 performing ECC encoding on the host data HD.

In an exemplary embodiment, metadata MD for managing the data DT may be generated while the non-volatile memory 140 stores the data DT. The non-volatile memory 140 or a processor (not shown) of the second controller 100 may generate the metadata MD. In addition, the volatile memory 130 may store the metadata MD. For example, the metadata MD as management information may include information on the physical address, information on pass/fail of a data program, information on a temperature of the non-volatile memory 140, and information on elapsed time after writing data. For example, the metadata MD could include a mapping table that maps a logical address of the host associated with the data DT to a physical address within the non-volatile memory 140 and/or to a physical address within memory device 200. For example, if the controller 100 attempted to write the data DT from the non-volatile memory 140 to the memory device 200, and the write failed, the metadata MD could indicate that the programming of the data DT failed. For example, if the controller 100 completed writing the data DT from the non-volatile memory 140 to the memory device 200 in a certain amount of time, the metadata MD associated with the data DT could include the certain amount.

The volatile memory 130 may include a plurality of memory cells each having a state corresponding to the stored data. The volatile memory 130 may include volatile memory cells that lose the stored data when power supply is blocked. For example, the volatile memory 130 may include dynamic RAM (DRAM), static RAM (SRAM), mobile DRAM, double data rate synchronous DRAM (DDR SDRAM), low power DDR (LPDDR) SDRAM, graphic DDR (GDDR) SDRAM, or Rambus DRAM (RDRAM).

The scheduler 150 may output the data DY and various signals to the memory device 200 through the second memory interface 120 based on a previously set schedule (or a previously set programming technique). For example, the scheduler 150 may output commands such as read, write, erase, stop erasing, and stop writing that are received from the first controller 10 to the memory device 200 in the previously defined order. In addition, the scheduler 150 may output the data DY received from the memory device 200 based on the previously set schedule to the first controller 10 through the first memory interface 110. For example, the scheduler 150 may be implemented by at least one of hardware, software, and firmware.

Figure 4:
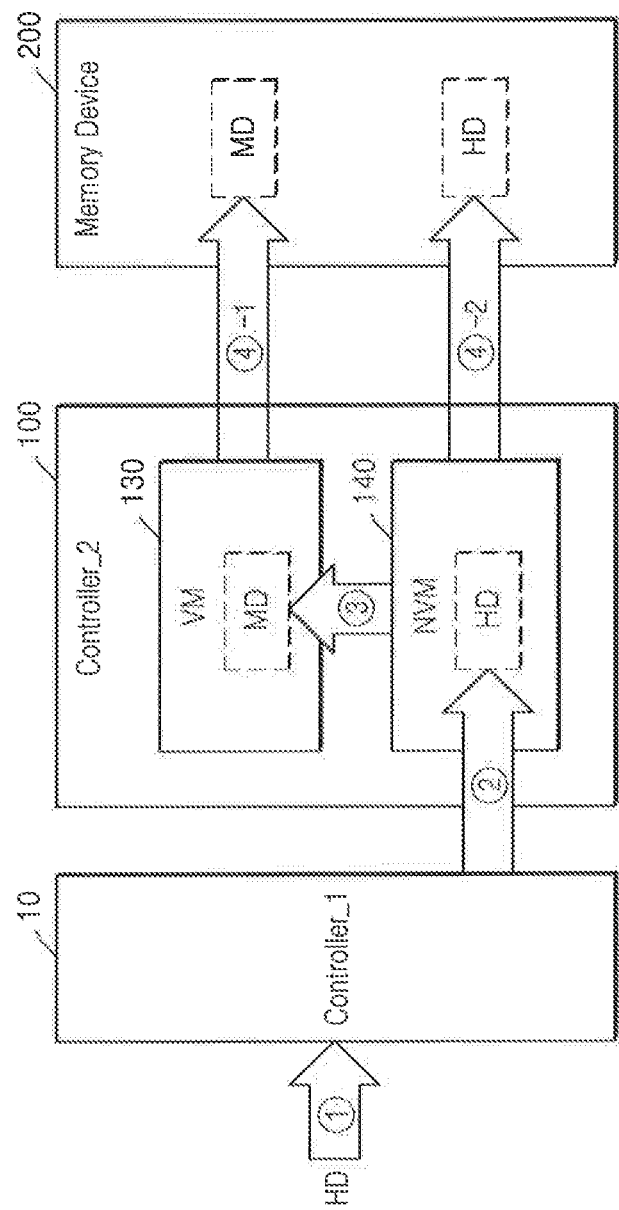
FIG. 4 is a view illustrating a movement of data according to an exemplary embodiment of the inventive concept.

FIG. 4 is a view illustrating a movement of data according to an exemplary embodiment of the inventive concept.

Referring to FIG. 4, the first controller 10 receives the host data HD from the host HOST (①). In FIG. 4, the movement of the data is described based on the host data HD, as an example. The same inventive concept may be applied to the data generated by the first controller 10.

The second controller 100 receives the host data HD from the first controller 10 and stores the host data HD in the non-volatile memory 140 (②). For example, the first controller 10 outputs a command for instructing the host data HD to be stored in the non-volatile memory 140 and the second controller 100 stores the host data HD in the non-volatile memory 140 in response to the command. In another example, the first controller 10 outputs a command for instructing the host data HD to be stored in the memory device 200 and the second controller 100 stores the host data HD in the non-volatile memory 140 in response to the command.

The non-volatile memory 140 generates the metadata MD for managing the host data HD while storing the host data HD and provides the metadata MD to the volatile memory 130 (③). The volatile memory 130 stores the received metadata MD and may output the metadata MD to the memory device 200 through the second memory interface 120 (FIG. 3), for example, in accordance with scheduling of the scheduler 150 (④-1). In addition, the non-volatile memory 140 may output the stored host data HD to the memory device 200 through the second memory interface 120, for example, in accordance with the scheduling of the scheduler 150 (④-2).

The memory system 1 according to an inventive concept includes the second controller 100 located between the first controller 10 and the memory device 200 and accordingly, the first controller 10 may reduce a burden on complicated management and operation processing requests of the memory device 200. In addition, the second controller 100 includes the non-volatile memory 140 that operates as a buffer for the memory device 200, and the non-volatile memory 140 may store a large amount of data and may retain the stored data even if a sudden power failure occurs. Since loss of data is prevented when a sudden power failure occurs, the memory system 1 is not required to include a large capacity capacitor to provide auxiliary power when a sudden power failure occurs.

Figure 5A:
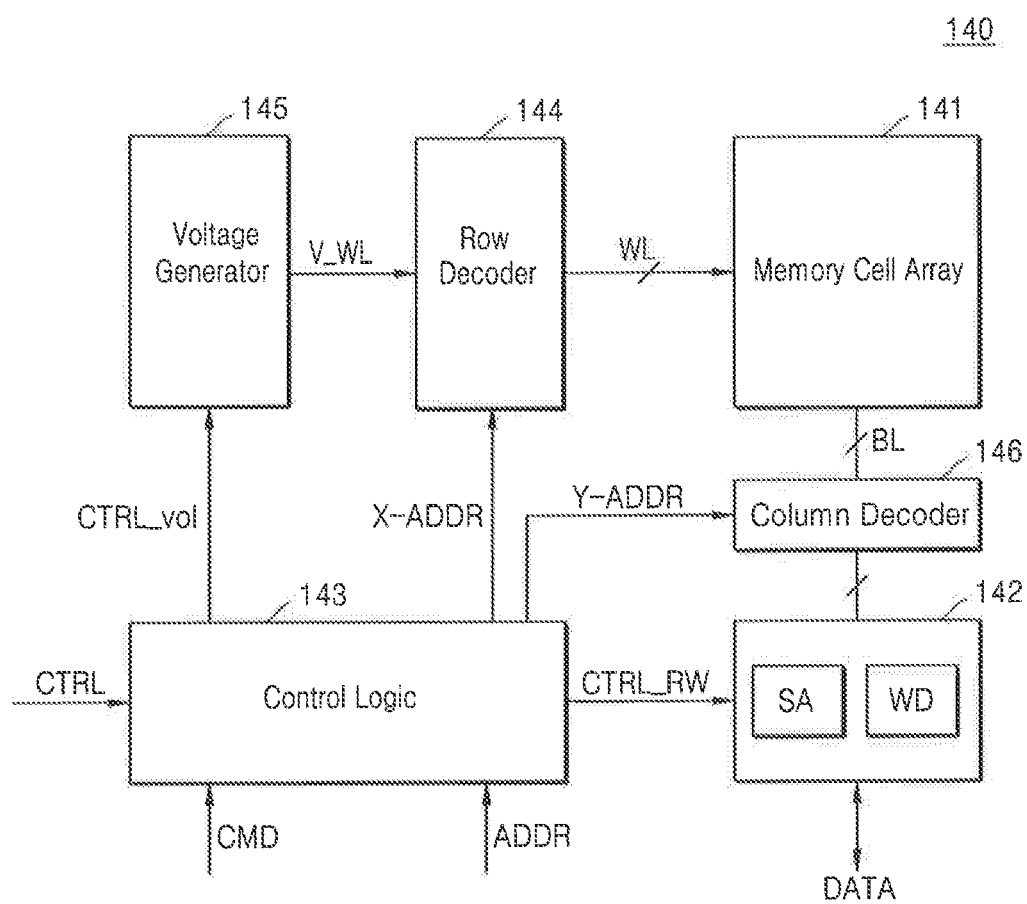
FIG. 5A is a block diagram of a non-volatile memory according to an exemplary embodiment of the inventive concept.
Figure 5B:
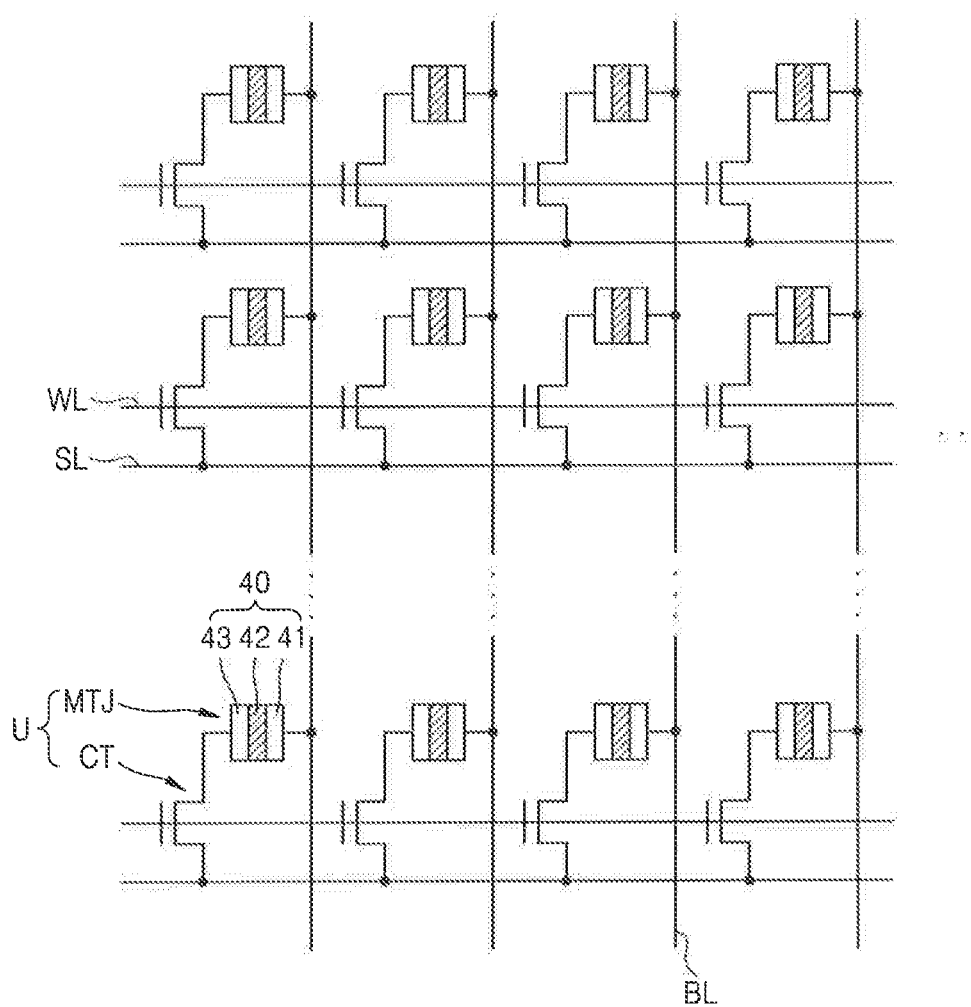
FIG. 5B is a circuit diagram of a memory cell array of FIG. 5A.
Figure 5C:
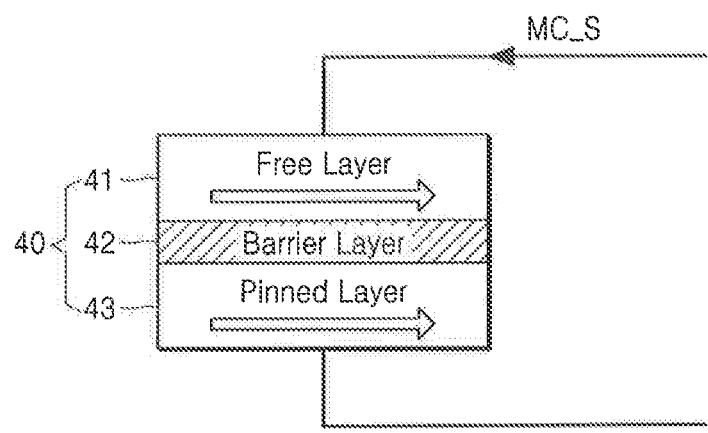
FIGS. 5C and 5D are conceptual diagrams illustrating data stored in a magnetization direction in a magnetic tunnel junction (MTJ) structure of FIG. 5B.
Figure 5D:
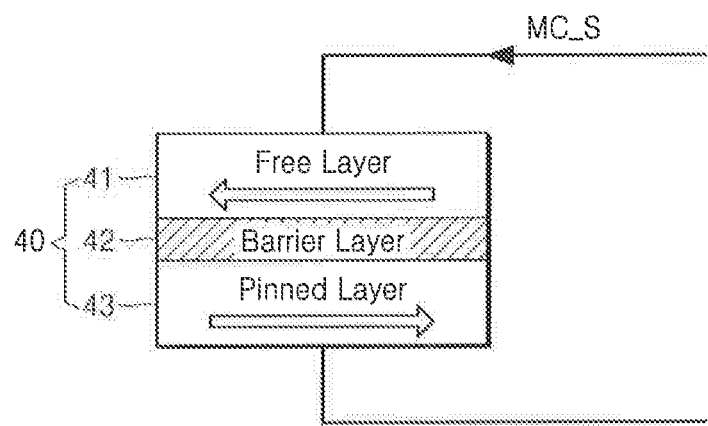

FIG. 5A is a block diagram of a non-volatile memory 140 according to an exemplary embodiment of the inventive concept. FIG. 5B is a circuit diagram of a memory cell array 141 of FIG. 5A. FIGS. 5C and 5D are conceptual diagrams illustrating data stored in a magnetization direction in a magnetic tunnel junction (MTJ) structure 40 of FIG. 5B. For example, FIGS. 5A and 5B may illustrate the non-volatile memory 140 of FIG. 1.

Referring to FIG. 5A, the non-volatile memory 140 includes a memory cell array 141, a writing/reading circuit 142, a control logic 143 (e.g., a logic circuit), a row decoder 144 (e.g., a decoding circuit), a voltage generator 145, and a column decoder 146 (e.g., a decoding circuit). The writing/reading circuit 142 may include a sense amplifier SA and a write driver WD (e.g., a driving circuit).

Memory cells included in the memory cell array 141 may be connected to a plurality of first signal lines and a plurality of second signal lines. The plurality of first signal lines may be bit lines BL and the plurality of second signal lines may be word lines WL. As various voltage signals or current signals are provided through the plurality of bit lines BL and word lines WL, data is written in or read from selected memory cells and it is possible to prevent data from being written in or read from the remaining non-selected memory cells.

The address ADDR for instructing a memory cell to be accessed may be received together with the command CMD and the address ADDR may include a row address X-ADDR for selecting the word lines WL of the memory cell array 141 and a column address Y-ADDR for selecting the bit lines BL of the memory cell array 141. The row decoder 144 performs a word line selecting operation in response to the row address X-ADDR and the column decoder 146 may perform a bit line selecting operation in response to the column address Y-ADDR.

The writing/reading circuit 142 is connected to the bit lines BL and may write data in or read data from a memory cell. For example, at least a part of a voltage signal or a current signal may be provided to the memory cell array 141 through the writing/reading circuit 142. In the current embodiment, the writing/reading circuit 142 is illustrated as being connected to the bit lines BL. However, in another embodiment, the writing/reading circuit 142 may be connected to the word lines WL.

In an exemplary embodiment, the control logic 143 outputs a control signal CTRL_RW for writing data in or reading data from the memory cell array 141 and a control signal CTRL_vol for generating various voltages based on the command CMD, the address ADDR, and a control signal CTRL that are received from the first controller 10. In an embodiment, the voltage generator 145 generates a word line voltage V_WL based on the control signal CTRL_vol. For example, the voltage generator 145 may be capable of generating different voltages for output based on a state of the control signal CTRL_vol. Therefore, the control logic 143 may control various operations in the non-volatile memory 140.

Referring to FIG. 5B, the memory cell array 141 may include the plurality of word lines WL, the plurality of bit lines BL, a plurality of source lines SL, and a plurality of memory cells U arranged in a region in which the word lines WL and the bit lines BL intersect with each other. The memory cell array 141 may include, for example, an MRAM cell array.

One unit memory cell U includes the MTJ structure 40 and a cell transistor CT and may be selected by selecting one bit line BL and one source line SL. For example, the memory cell array 141 may have a 1MTJ-1TR structure.

In an exemplary embodiment, the MTJ structure 40 includes a free layer 41, a barrier layer 42, and a pinned layer 43. The free layer 41 is connected to a bit line BL and the pinned layer 43 is connected to a drain of the cell transistor CT. In addition, a source of the cell transistor CT is connected to a source line SL and a gate of the cell transistor CT is connected to a word line WL.

On the other hand, the MTJ structure 40 may be replaced by a resistive element such as PRAM using a phase change material or a PRAM using a variable resistance material such as a complex metal oxide. In addition, the MTJ structure 40 may be replaced by a resistive element such as an MRAM using a ferroelectric material. Materials including resistive elements have resistance values that vary in accordance with a magnitude and/or a direction of a current or a voltage and may have a non-volatile characteristic in which the resistance values are maintained even though the current or the voltage is blocked.

Referring to FIGS. 5C and 5D, a resistance value of the MTJ structure 40 may vary in accordance with a magnetization direction of the free layer 41. When a memory cell reading signal MC_S is applied to the MTJ structure 40, a data voltage in accordance with the resistance value of the MTJ structure 40 may be output. On the other hand, since an intensity of the memory cell reading signal MC_S is much smaller than an intensity of a program signal, the magnetization direction of the free layer 41 is not changed by the memory cell reading signal MC_S.

As illustrated in FIG. 5C, in the MTJ structure 40, the magnetization direction of the free layer 41 and a magnetization direction of the pinned layer 43 are arranged in parallel. The MTJ structure in such a state may have a small resistance value. For example, data "0" may be output through a reading operation.

As illustrated in FIG. 5D, in the MTJ structure 40, the magnetization direction of the free layer 41 is anti-parallel with the magnetization direction of the pinned layer 43. The MTJ structure 40 in such a state may have a large resistance value. For example, data "1" may be output through the reading operation.

Figure 6:
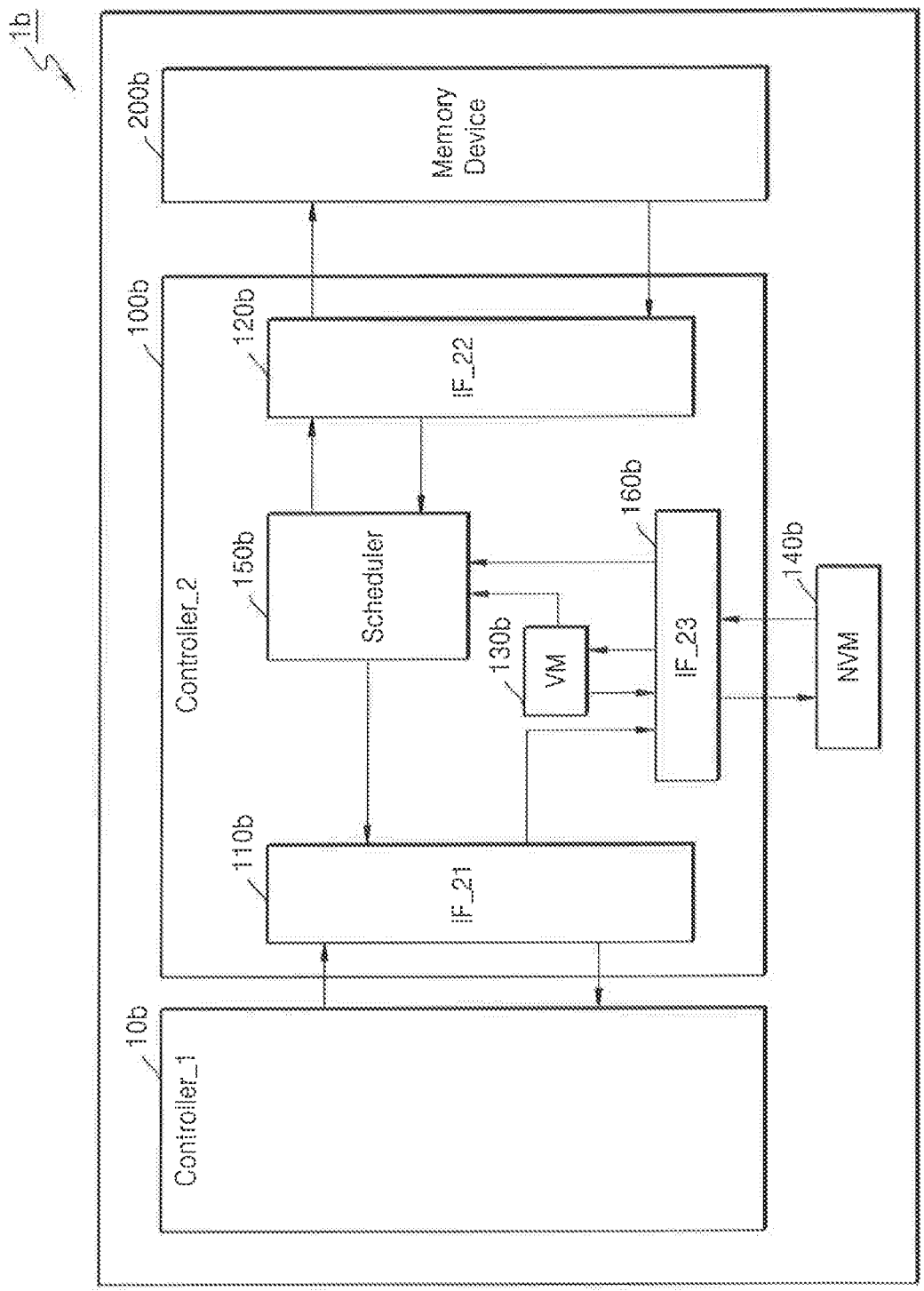
FIG. 6 is a block diagram illustrating a memory system according to an exemplary embodiment of the inventive concept.

FIG. 6 is a block diagram illustrating a memory system 1b according to an exemplary embodiment of the inventive concept. Among the elements of FIG. 6, description of the same elements as those of FIG. 3 will not be given.

Referring to FIG. 6, a non-volatile memory 140b is located outside a second controller 100b and the second controller 100b further includes a third memory interface 160b (e.g., an interface circuit). The third memory interface 160b may include a protocol for exchanging various signals and data items between the second controller 100b and the non-volatile memory 140b.

In an exemplary embodiment, the second controller 100b transmits data received from a first controller 10b to the non-volatile memory 140b. In an exemplary embodiment, the second controller 100b receives data from the first controller 10b through a first memory interface 110b and transmits the received data to the non-volatile memory 140b through the third memory interface 160b. The non-volatile memory 140b may be similar to the non-volatile memory 140 shown in FIG. 1, FIG. 3, FIG. 4, or FIG. 5A.

The non-volatile memory 140b stores the received data and may transmit metadata MD for managing the data to the second controller 100b. The second controller 100b may receive the metadata MD from the non-volatile memory 140b through the third memory interface 160b or generate the metadata MD. In an exemplary embodiment, a volatile memory 130b stores the metadata MD and may transmit the stored metadata MD to a memory device 200b in accordance with scheduling of a scheduler 150b. In an exemplary embodiment, the non-volatile memory 140b transmits the stored data to the memory device 200b through the third memory interface 160b, the scheduler 150b, and a second memory interface 120b. The memory device 200b may be similar to the memory device 200 shown in FIG. 1 or FIG. 4.

Figure 7:
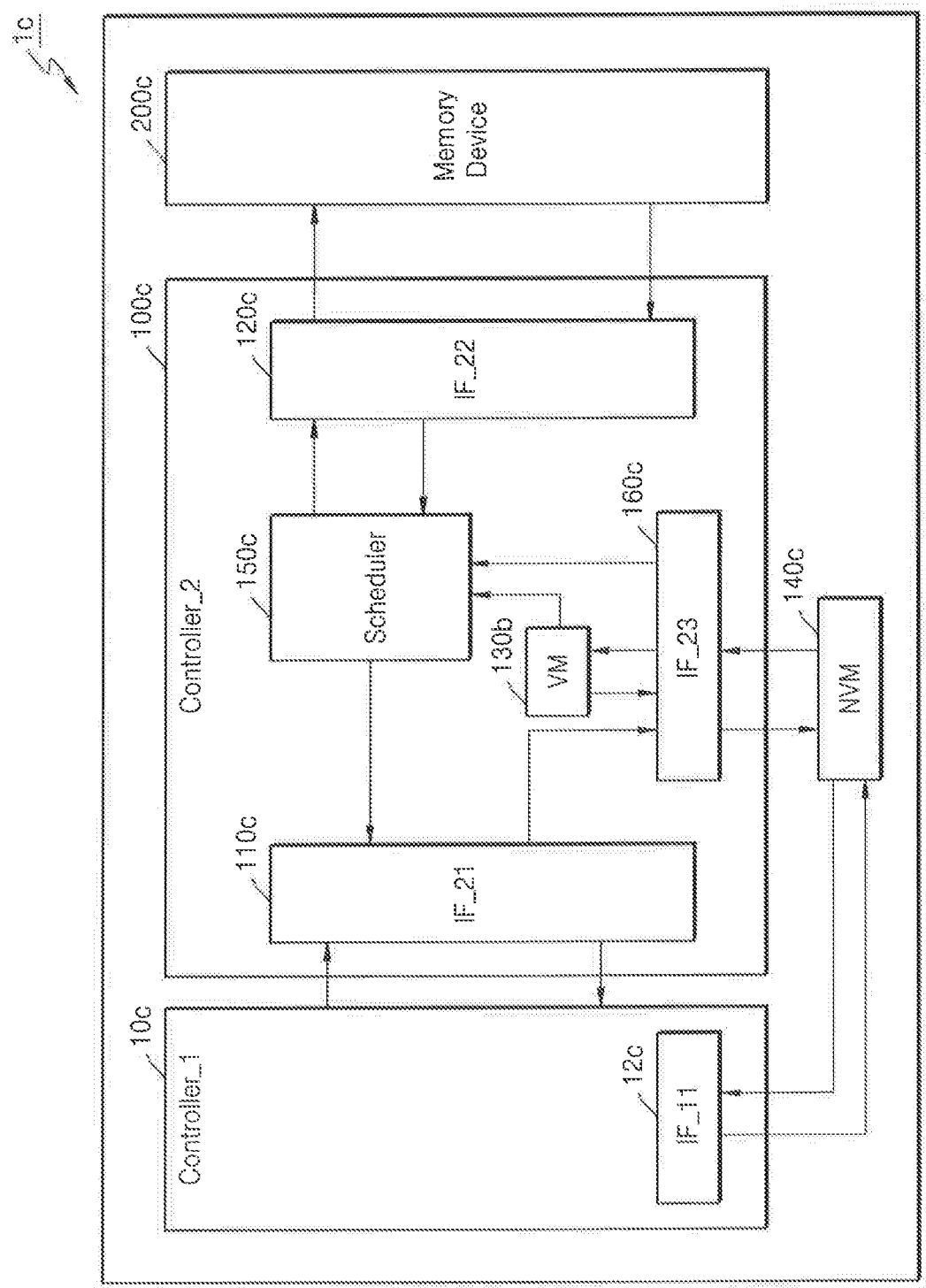
FIG. 7 is a block diagram illustrating a memory system according to an exemplary embodiment of the inventive concept.

FIG. 7 is a block diagram illustrating a memory system 1c according to an exemplary embodiment of the inventive concept. Among the elements of FIG. 7, description of the same elements as those of FIG. 6 will not be given.

Referring to FIG. 7, a non-volatile memory 140c is located outside a second controller 100c and the second controller 100c further includes a third memory interface 160c. The non-volatile memory 140c may be similar to the non-volatile memory 140b or the non-volatile memory 140. In an embodiment, a first controller 10c further includes a memory interface 12c for transmitting various signals to and receiving various signals from the non-volatile memory 140c. The memory interface 12c may include a protocol for exchanging various signals and data items between the first controller 10c and the non-volatile memory 140c.

In an exemplary embodiment, the first controller 10c directly transmits data to the non-volatile memory 140c through the memory interface 12c. For example, the first controller 10c may provide the host data HD received from the host HOST or data generated by the first controller 10c to the non-volatile memory 140c by directly accessing the non-volatile memory 140c. In addition, the first controller 10c may receive the data read from the non-volatile memory 140c through the memory interface 12c. Therefore, the first controller 10c directly accesses the non-volatile memory 140c or may indirectly access the non-volatile memory 140c through the second controller 100c.

Figure 8A:
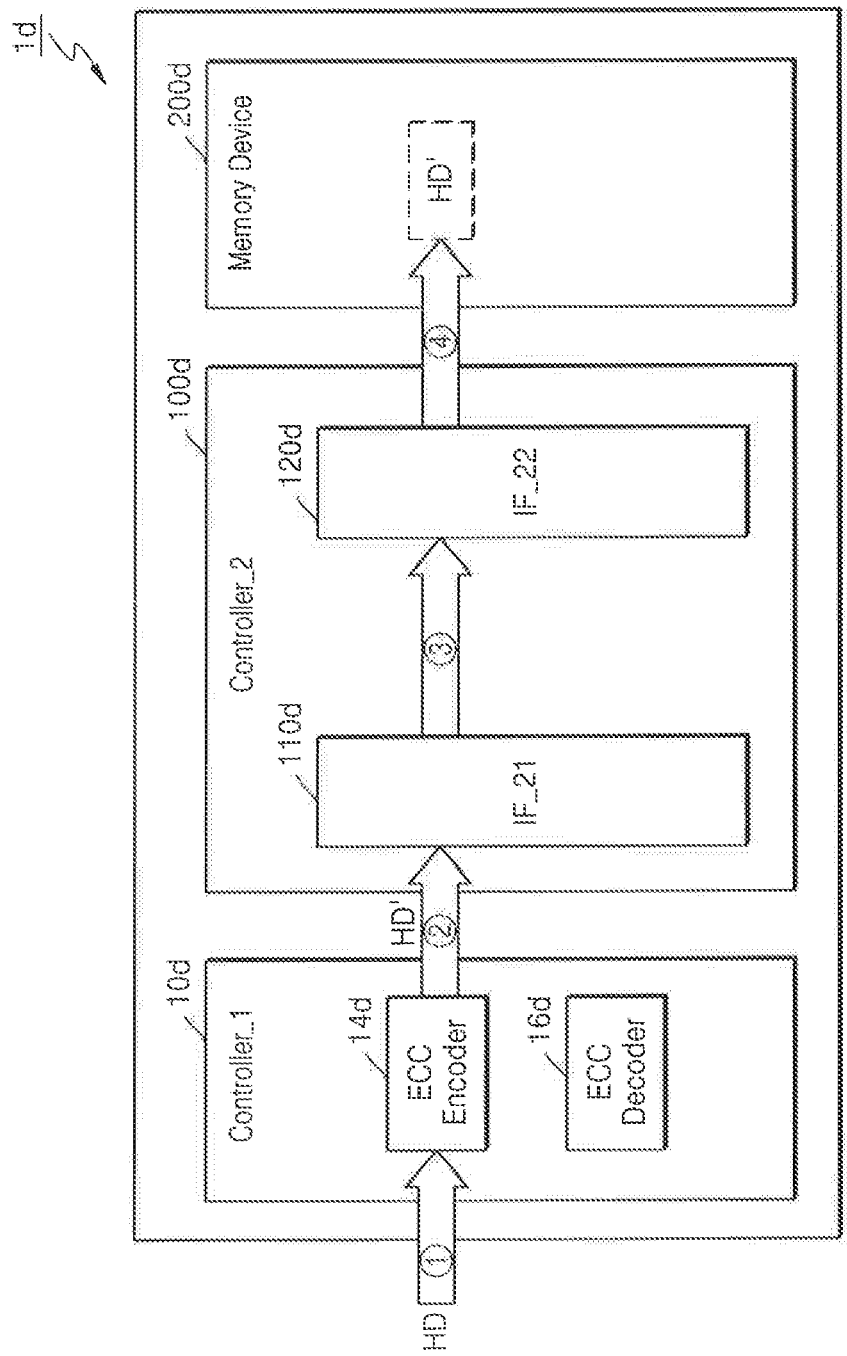
FIG. 8A is a view illustrating an error correction code (ECC) encoding process according to an exemplary embodiment of the inventive concept.
Figure 8B:
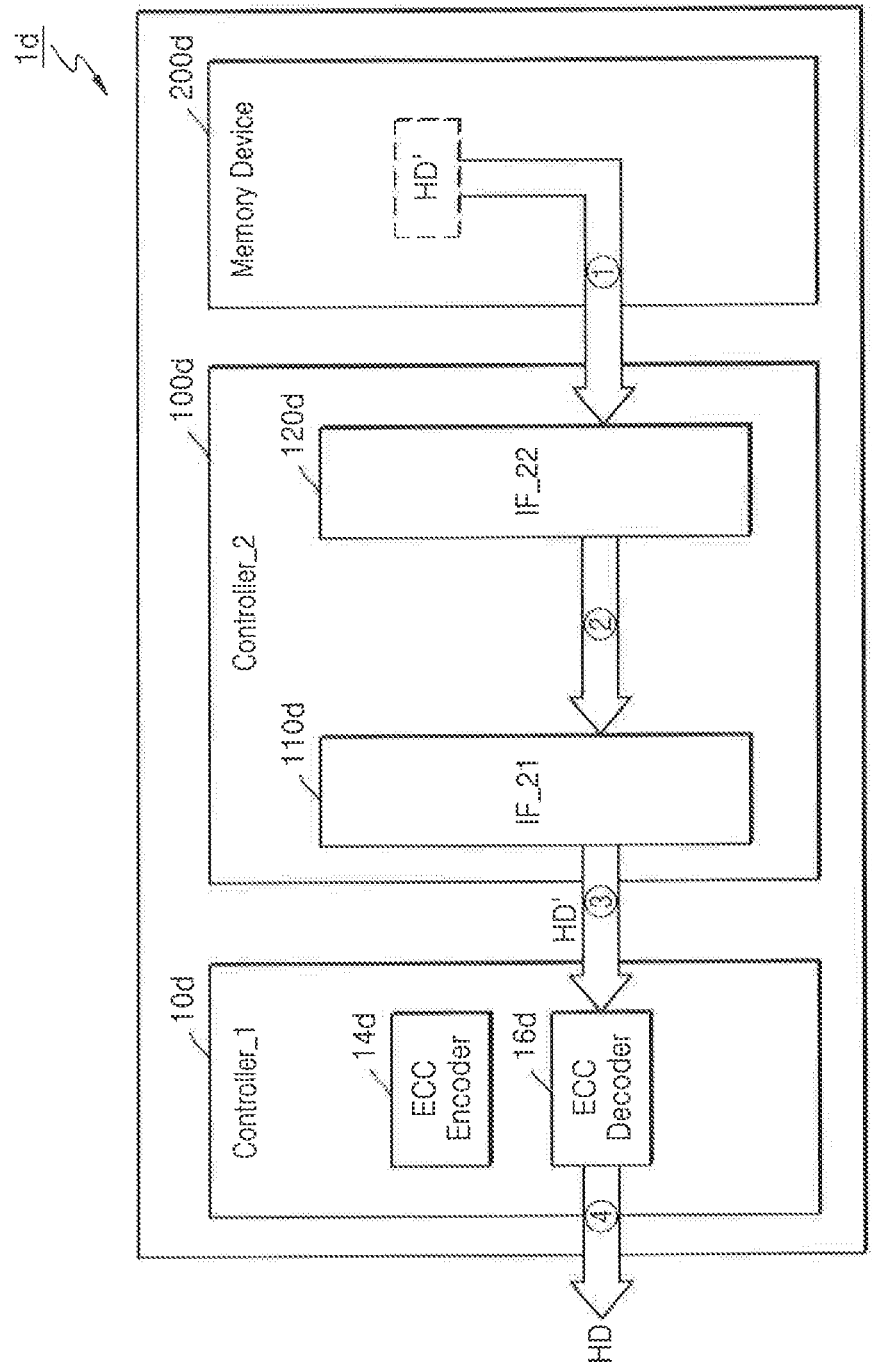
FIG. 8B is a view illustrating an ECC decoding process according to an exemplary embodiment of the inventive concept.

FIG. 8A is a view illustrating an error correction code (ECC) encoding process according to an exemplary embodiment of the inventive concept being performed in a memory system 1d. FIG. 8B is a view illustrating an ECC decoding process according to an exemplary embodiment of the inventive concept being performed in the memory system 1d.

Referring to FIG. 8A, a first controller 10d receives the host data HD from the host HOST (①). In FIG. 8A, a movement of data is described based on the host data HD, as an example. The same inventive concept may be applied to the data generated by the first controller 10d.

The first controller 10d includes an ECC encoder 14d (e.g., an encoder circuit) and an ECC decoder 16d (e.g., a decoder circuit). The ECC encoder 14d may perform the ECC encoding on the received host data HD. The first controller 10d outputs host data HD' obtained by performing the ECC encoding on the host data HD to a second controller 100d (②).

The second controller 100d receives the host data HD' obtained by performing the ECC encoding on the host data HD through a first memory interface 110d and transmits the host data HD' to a second memory interface 120d (③). The second controller 100d transmits the host data HD' obtained by performing the ECC encoding on the host data HD to a memory device 200d through the second memory interface 120d (④). That is, the second controller 100d may transmit the host data HD' obtained by performing the ECC encoding on the host data HD from the first controller 10d to the memory device 200d. The memory device 200d may store the received host data HD'.

Referring to FIG. 8B, when the host data HD' stored in the memory device 200d is read, the second controller 100d receives the host data HD' through the second memory interface 120e (①). The second controller 100d transmits the host data HD' received through the second memory interface 120d to the first memory interface 110d (②) and outputs the host data HD' to the first controller 10d through the first memory interface 110d (③). That is, the second controller 100d may transmit the host data HD' read from the memory device 200d to the first controller 10d.

The ECC decoder 16d provided in the first controller 10d may perform the ECC decoding on the host data HD' received from the second controller 100d. The first controller 10d may output the host data HD on which the ECC decoding is performed to, for example, the host HOST (④).

Figure 9A:
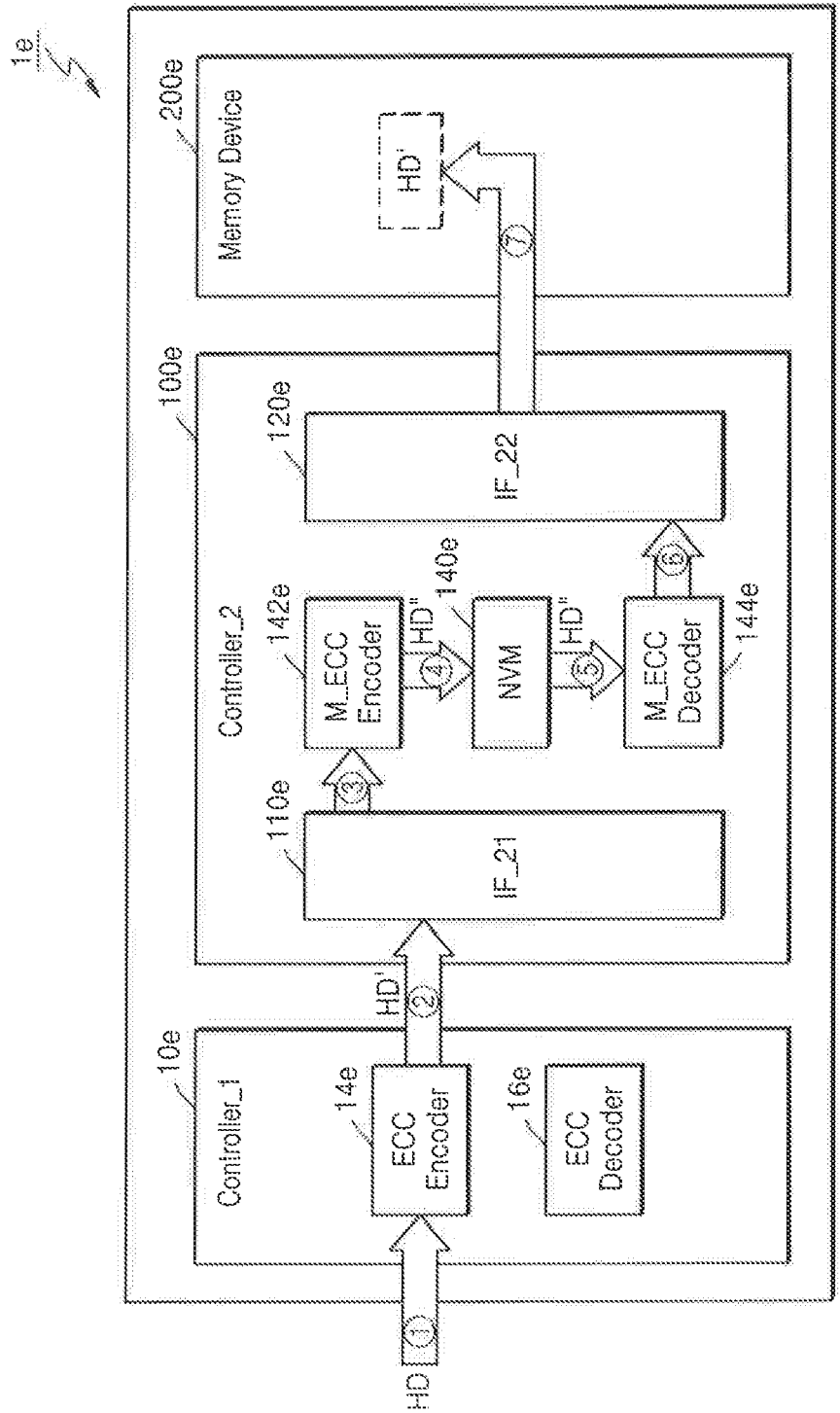
FIG. 9A is a view illustrating an ECC encoding process according to an exemplary embodiment of the inventive concept.
Figure 9B:
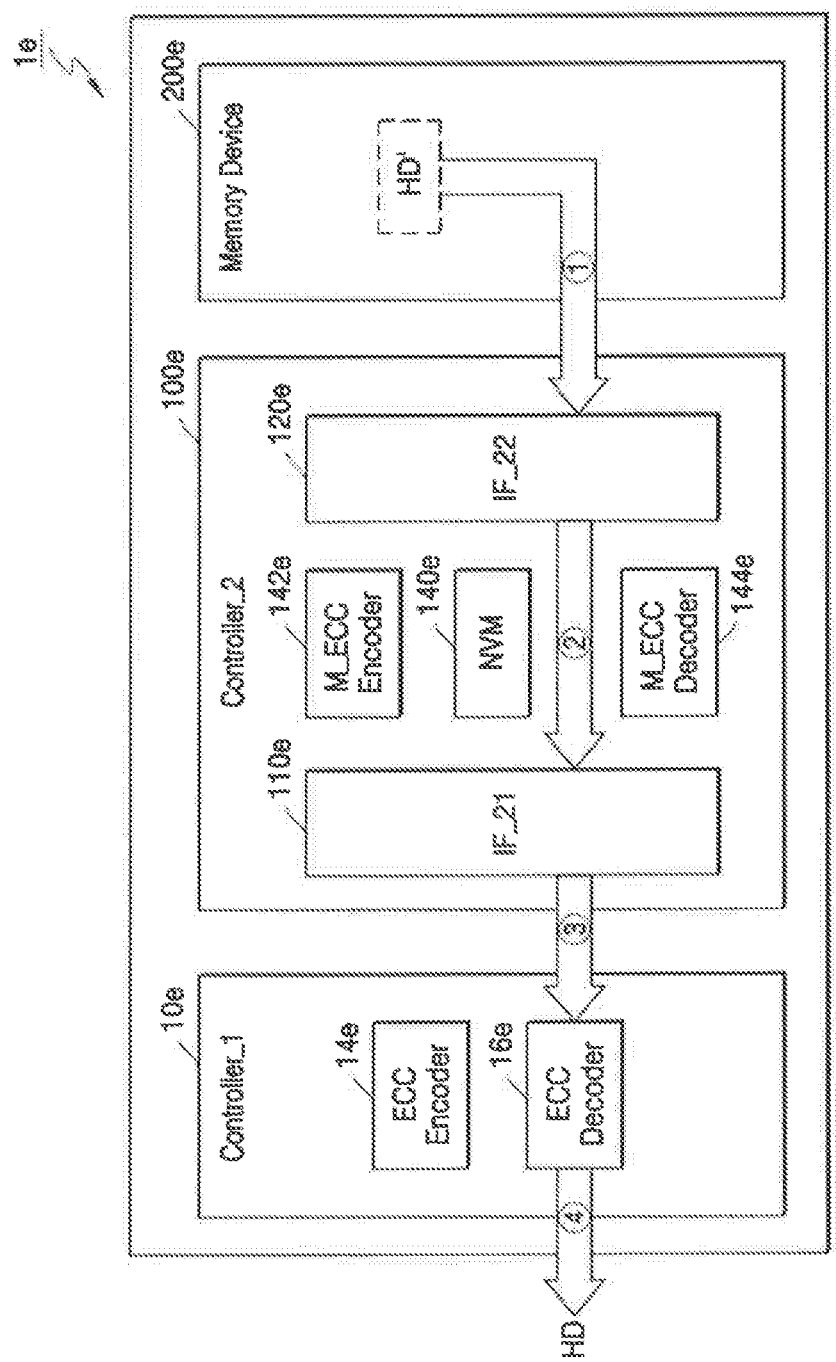
FIG. 9B is a view illustrating an ECC decoding process according to an exemplary embodiment of the inventive concept.

FIG. 9A is a view illustrating an ECC encoding process according to an exemplary embodiment of the inventive concept of a memory system 1e. FIG. 9B is a view illustrating an ECC decoding process according to an exemplary embodiment of the inventive concept of the memory system 1e. Among the elements of FIGS. 9A and 9B, description of the same elements as those of FIGS. 8A and 8B will not be given.

Referring to FIG. 9A, a first controller 10e receives the host data HD from the host HOST (①) and an ECC encoder 14e performs the ECC encoding on the received host data HD. The first controller 10e outputs the host data HD' obtained by performing the ECC encoding on the host data HD to the second controller 100e (②).

In an exemplary embodiment, the second controller 100e further includes an ECC encoder 142e for a non-volatile memory and an ECC decoder 144e for a non-volatile memory. The ECC encoder 142e for a non-volatile memory performs the ECC encoding on data to be stored in a non-volatile memory 140e and the ECC decoder 144e for a non-volatile memory performs the ECC decoding on data read from the non-volatile memory 140e.

The second controller 100e receives the host data HD' obtained by performing the ECC encoding on the host data HD through a first memory interface 110e and transmits the host data HD' to the ECC encoder 142e for a non-volatile memory (③). The ECC encoder 142e for a non-volatile memory performs ECC encoding for a non-volatile memory on the host data HD' and transmits host data HD" obtained by performing the ECC encoding for the non-volatile memory on the host data HD' to the non-volatile memory 140e (④). The non-volatile memory 140e stores the host data HD".

For example, based on the scheduling of the scheduler 150 (FIG. 2), the host data HD" stored in the non-volatile memory 140e may be transmitted to a memory device 200e. For this, the host data HD" read from the non-volatile memory 140e is transmitted to the ECC decoder 144e for a non-volatile memory (⑤). The ECC decoder 144e for a non-volatile memory performs ECC decoding for a non-volatile memory on the host data HD" to generate the host data HD' output by the ECC Encoder 14e and transmits the host data HD' to a second memory interface 120e (⑥). The second controller 100e transmits the host data HD' to the memory device 200e through the second memory interface 120e (⑦). The memory device 200e stores the received host data HD'.

Referring to FIG. 9B, when the host data HD' stored in the memory device 200e is read, the second controller 100e receives the host data HD' through the second memory interface 120e (①) and transmits the host data HD' to the first memory interface 110e (②). The second controller 100e outputs the host data HD' to the first controller 10e through the first memory interface 110e (③) and an ECC decoder 16e provided in the first controller 10e performs the ECC decoding on the host data HD' to generate host data HD. The first controller 10e outputs the host data HD to, for example, the host HOST (④).

Figure 10A:
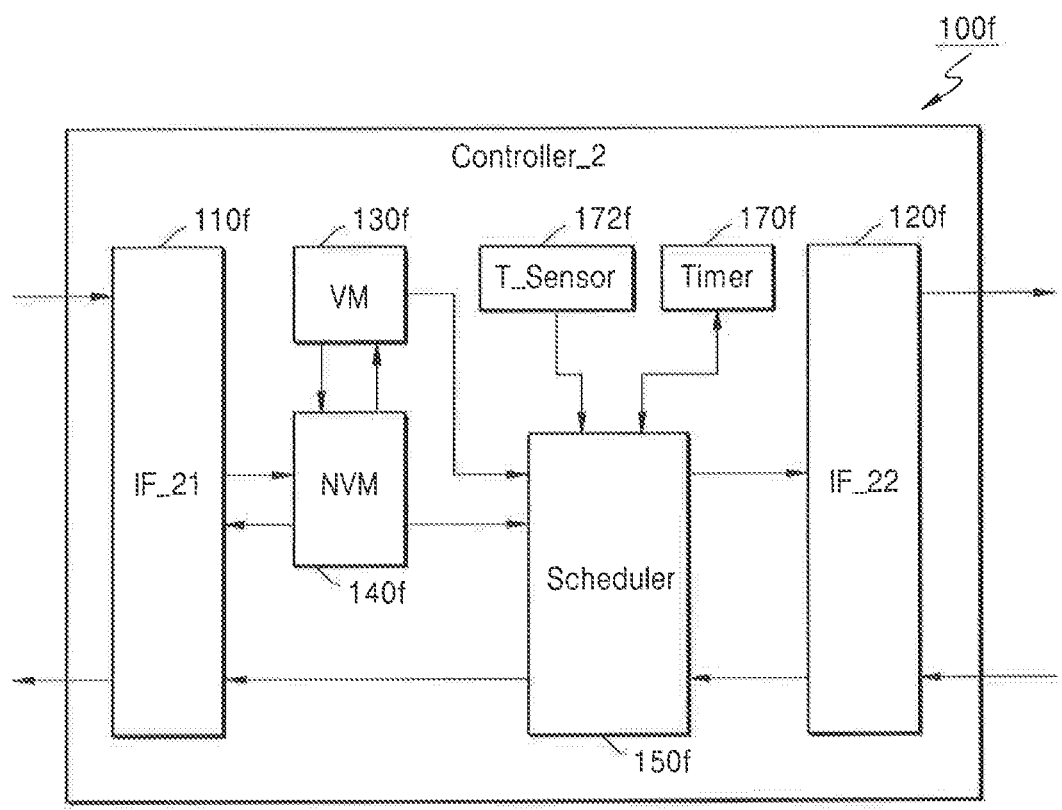
FIG. 10A is a block diagram illustrating a detailed configuration of a second controller according to an exemplary embodiment of the inventive concept.
Figure 10B:
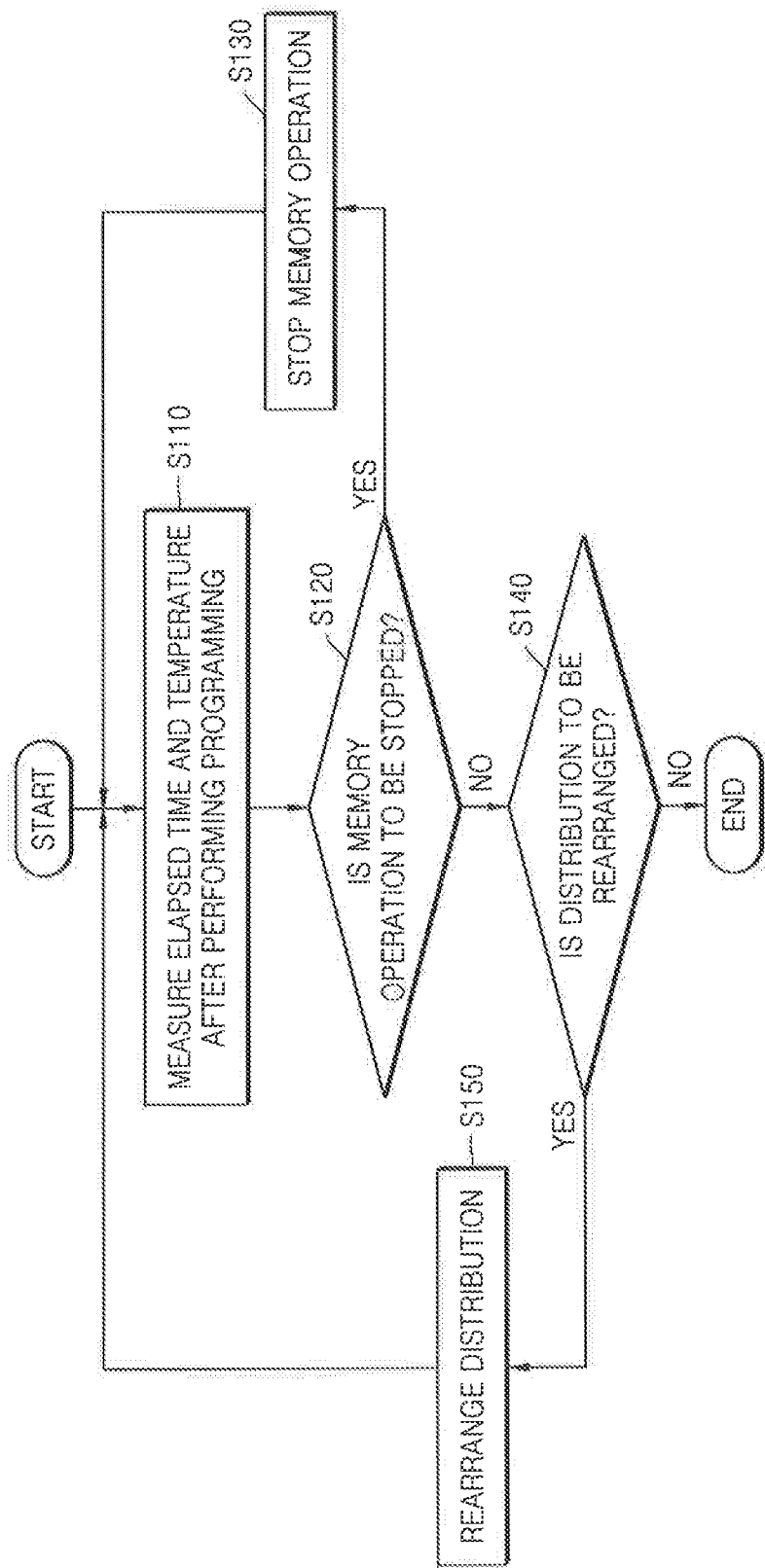
FIG. 10B is a flowchart illustrating an operation of a second controller.

FIG. 10A is a block diagram illustrating a detailed configuration of a second controller 100f according to an exemplary embodiment of the inventive concept. FIG. 10B is a flowchart illustrating an operation of the second controller 100f. Among the elements of FIG. 10A, description of the same elements as those of FIG. 3 is omitted. Any of the previously described second controllers (e.g., 100, 100a, 100b, 100c, 100d, or 100e) can be replaced with second controller 100f.

Referring to FIG. 10A, the second controller 100f further includes a timer 170f (e.g., a timer circuit) and a temperature sensor 172f. For example, the temperature sensor 172f could include a negative temperature coefficient thermistor, a resistance temperature detector, a thermocouple, or a semiconductor-based temperature sensor. The timer 170f may measure an elapsed time after programming data in the memory device (for example, 200 of FIG. 1) based on scheduling information of a scheduler 150f. In addition, the temperature sensor 172f may measure a current temperature of the memory device (for example, 200 of FIG. 1). However, the inventive concept is not limited thereto. The temperature sensor 172f may measure a temperature of the second controller 100f or a temperature of the first controller (for example, 10 of FIG. 1).

The second controller 100f may control a signal and data output to the memory device (for example, 200 of FIG. 1) based on the information measured by the timer 170f and the temperature sensor 172f. For example, when the elapsed time after programming of prescribed data measured by the timer 170f is greater than or equal a previously set threshold value, the scheduler 150f may rearrange a distribution of memory cells in which the corresponding data is stored. For example, if the second controller 100f writes the prescribed data to a first set of memory cells and it takes longer than a certain amount of time complete, the second controller 100f can direct that the prescribed data be moved from the first set of memory cells to a second other set of memory cells. In addition, for example, when the temperature measured by the temperature sensor 172f is greater than or equal a previously set threshold value, the scheduler 150f may stop the signal and data output to the memory device (for example, 200 of FIG. 1) for a prescribed time. For example, if the second controller 100f is to write data to memory cells of the memory device (e.g., 200, 200b, 200c, etc.) on behalf of a first memory controller (e.g., 10, 10b, 10c, etc.), and the second controller 100f determines that the temperature is too high, the second controller 100f can hold off performing the write for a certain period of time.

An operation of the second controller 100f will be described in detail with reference to FIG. 10B. The second controller 100f measures the elapse timed after programming the prescribed data in the memory device (for example, 200 of FIG. 1) through the timer 170f and may measure the temperature of the memory device (for example, 200 of FIG. 1) through the temperature sensor 172f in operation S110. For example, the timer 170f and the temperature sensor 172f may respectively measure the elapsed time and the temperature to generate measured information and provide the measured information to the scheduler 150f after respectively performing programming in prescribed periods. In another example, when the respectively measured elapsed time and temperature after performing programming are greater than or equal previously set threshold values, the timer 170f and the temperature sensor 172f may provide the measured information to the scheduler 150f in accordance with the occurrence of an event.

In an exemplary embodiment, the second controller 100f determines whether to stop a memory operation of the memory device (for example, 200 of FIG. 1) based on the temperature information measured by the temperature sensor 172f in operation S120. For example, when the temperature measured by the temperature sensor 172f is greater than or equal a previously set threshold value, the scheduler 150f stops the memory operation such as data programming for a prescribed time in operation S130.

When the temperature measured by the temperature sensor 172f is lower than the previously set threshold value, the second controller 100f determines whether to rearrange the distribution of the memory cells based on the information measured by the timer 170f in operation S140. For example, when the elapsed time after performing programming, which is measured by the timer 170f, is greater than or equal the previously set threshold value, the second controller 100f controls rearrangement of the distribution of the memory cells in which corresponding data is stored in operation S150.

Figure 11A:
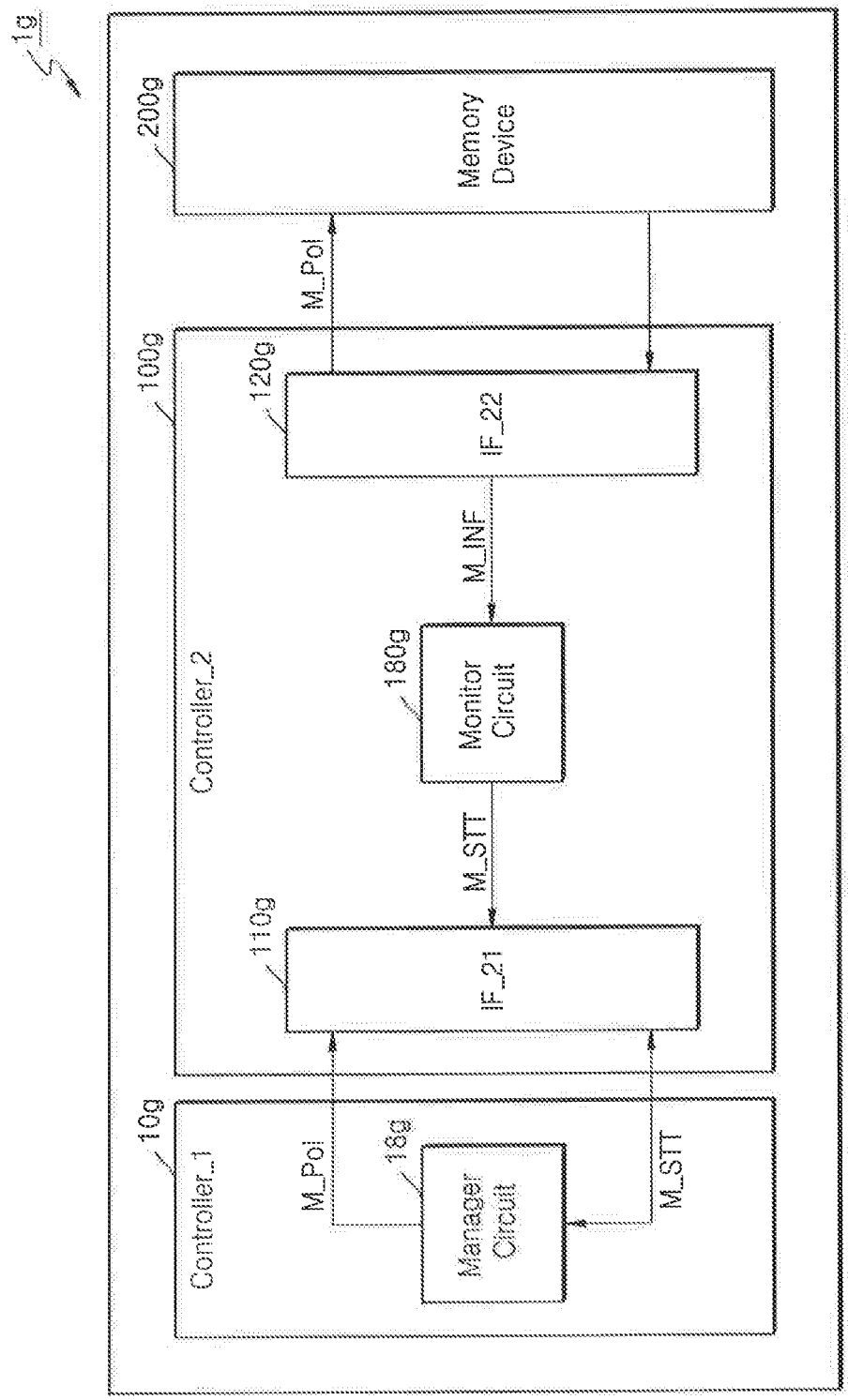
FIG. 11A is a block diagram illustrating a detailed configuration of a memory system according to an exemplary embodiment of the inventive concept.
Figure 11B:
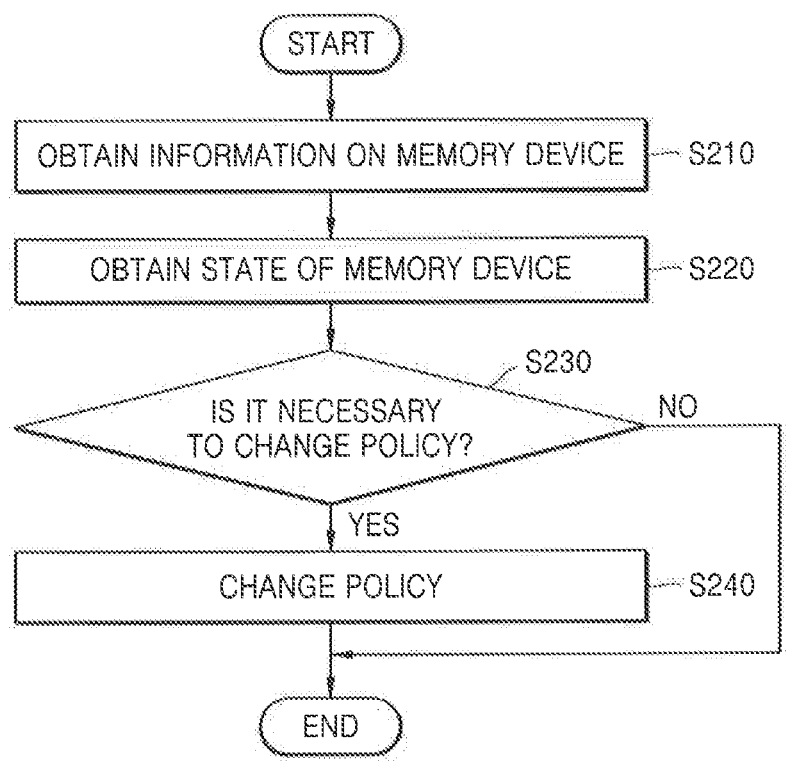
FIG. 11B is a flowchart illustrating an operation of a memory system.

FIG. 11A is a block diagram illustrating a detailed configuration of a memory system 1g according to an exemplary embodiment of the inventive concept. FIG. 11B is a flowchart illustrating an operation of the memory system 1g.

Referring to FIG. 11A, a first controller 10g includes a manager circuit 18g. In addition, a second controller 100g includes a first memory interface 110g, a second memory interface 120g, and a monitor circuit 180g.

In an exemplary embodiment, the second controller 100g obtains information M_INF on a memory device 200g from the memory device 200g through the second memory interface 120g. For example, the information M_INF may include at least one of data reading result information and information on the distribution of the memory cells in which the data is stored. The second controller 100g may monitor a state of the memory device 200g by transmitting the information M_INF to the monitor circuit 180g.

In an exemplary embodiment, the monitor circuit 180g transmits state information M_STT of the memory device 200g to the first controller 10g through the first memory interface 110g. The manager circuit 18g provided in the first controller 10g receives the state information M_STT and accordingly, the first controller 10g may check the state of the memory device 200g. The manager circuit 18g may change a policy for the memory device 200g or may perform defence code on the memory device 200g based on the received state information M_STT. In an exemplary embodiment, a defence code is used to determine an optimum or desirable level of a read voltage according to a change in a threshold voltage distribution of a non-volatile memory cells during a read operation of a non-volatile memory. For example, the manager circuit 18g may use the received state information M_STT to select one of a plurality of available defence codes, determine a level of a read voltage for performing a read operation based on the selected defence code, and perform the read operation by using the read voltage having the determined level. For example, when the manager circuit 18g determines a change in policy (for example, writing/erasing policy) for the memory device 200g based on the state information M_STT, the manager circuit 18g outputs a changed policy-related signal M_Pol to the second controller 100g. The second controller 100g may transmit the changed policy-related signal M_Pol received through the first memory interface 110g to the memory device 200g through the second memory interface 120g.

An operation of the memory system 1g will be described in detail with reference to FIG. 11B. The second controller 100g obtains the information M_INF on the memory device 200g from the memory device 200g in operation S210. The second controller 100g may obtain the state of the memory device 200g based on the information M_INF received from the memory device 200g in operation S220. For example, the monitor circuit 180g provided in the second controller 100g may determine the state of the memory device 200g based on the information M_INF including the information on the distribution of the memory cells.

The first controller 10g may obtain the state of the memory device 200g by the monitor circuit 180g providing the state information M_STT of the memory device 200g to the first controller 10g. For example, the first controller 10g requests the state information M_STT from the second controller 100g and the second controller 100g provides the state information M_STT to the first controller 10g in response to the request. In another example, when the obtained state information M_STT corresponds to a previously set condition, the second controller 100g provides the state information M_STT to the first controller 10g without the request of the first controller 10g. Alternatively, without the request of the first controller 10g, the second controller 100g provides the obtained state information M_STT to the first controller 10g every prescribed period. For example, the second controller 100g may provide the state information M_STT periodically to the first controller 10g.

The first controller 10g determines whether it is necessary to change a policy for the memory device 200g based on the received state information M_STT in operation S230. It may be determined by the manager circuit 18g whether it is necessary to change the policy for the memory device 200g. For example, when it is determined by the manager circuit 18g to change the policy for the memory device 200g based on the state information M_STT, the first controller 10g may change various policies for control of the memory device 200g in operation S240. In detail, the manager circuit 18g outputs the changed policy-related signal M_Pol and the changed policy-related signal M_Pol may be provided to the memory device 200g through the second controller 100g.

Figure 12:
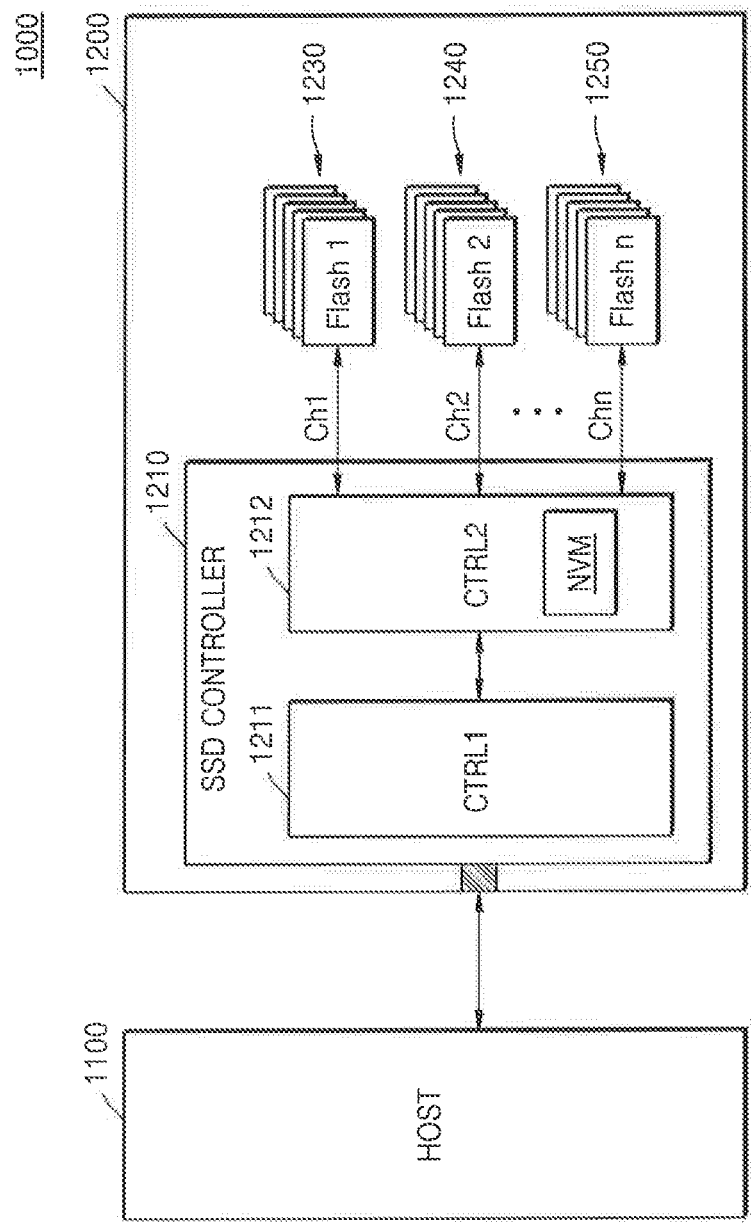
FIG. 12 is a block diagram illustrating an example in which each of memory systems according to exemplary embodiments of the inventive concept is applied to a solid state drive (SSD) system.

FIG. 12 is a block diagram illustrating an example in a memory system according to an exemplary embodiment of the inventive concept is applied to a solid state drive (SSD) system 1000.

Referring to FIG. 12, the SSD system 1000 includes a host 1100 (e.g., a host device) and an SSD 1200. The SSD 1200 transmits a signal to and receives a signal from the host 1100 through a signal connector and may receive power through a power connector. The SSD 1200 includes an SSD controller 1210 and a plurality of memory devices 1230, 1240, and 1250. The SSD controller 1210 includes a first controller 1211 and a second controller 1212. The second controller 1212 includes a non-volatile memory NVM. For example, the second controller 100 of FIG. 3 may be used to implement the second controller 1212.

The memory system according to an exemplary embodiment of the inventive concept may be mounted in or applied to a memory card system, a computing system, or a UFS as well as the SSD system 1000. In addition, the memory system according to an exemplary embodiment of the inventive concept may be applied to various kinds of electronic systems in each of which the non-volatile memory is mounted.

While the inventive concept has been particularly shown and described with reference to embodiments thereof, it will be understood that various changes in form and details may be made therein without departing from the spirit and scope of the inventive concept.

What is claimed is:

1. A memory system comprising:
    a memory device;
    a first controller configured to output a control signal for the memory device and data to be stored in the memory device based on a signal received from a host; and
    a second controller including a non-volatile memory configured to store the data, the second controller configured to receive the control signal and the data from the first controller, and control the memory device based on the control signal.

2. The memory system of claim 1, wherein the second controller comprises:
    a first memory interface electrically connected to the first controller; and
    a second memory interface electrically connected to the memory device.

3. The memory system of claim 2, wherein the second controller receives the data through the first memory interface and outputs the data to the memory device through the second memory interface.

4. The memory system of claim 1, wherein the first controller outputs a command for instructing the data to be stored in the non-volatile memory, and wherein the second controller stores the data in the non-volatile memory in response to the command.

5. The memory system of claim 1, wherein the first controller outputs a command for instructing the data to be stored in the memory device, and wherein the second controller stores the data in the non-volatile memory in response to the command.

6. The memory system of claim 1, wherein the second controller further comprises a volatile memory, wherein the non-volatile memory generates metadata for managing the data when the data is stored, and wherein the volatile memory stores the metadata.

7. The memory system of claim 1, wherein the second controller further comprises a scheduler for controlling an output of the control signal and the data to the memory device based on a previously set programming technique.

8. The memory system of claim 1, wherein the first controller further comprises:
   an error correction code (ECC) encoder for performing ECC encoding on the data; and
   an ECC decoder for performing ECC decoding on data read from the memory device, and
   wherein the second controller receives data encoded by the ECC encoder and transmits the encoded data to the memory device.

9. The memory system of claim 1, wherein the second controller further comprises:
   an error correction code (ECC) encoder for performing ECC encoding for the non-volatile memory on the data; and
   an ECC decoder for performing ECC decoding on data read from the non-volatile memory.

10. The memory system of claim 1, wherein the second controller further comprises:
    a temperature sensor for measuring a temperature of the memory device; and
    a timer for measuring an elapsed time after programming data in the memory device.

11. The memory system of claim 1, wherein the second controller further comprises a monitor circuit for receiving information on the memory device from the memory device and generating state information of the memory device based on the information, wherein the first controller further comprises a manager circuit for determining a change in policy for the memory device based on the state information.

12. The memory system of claim 1, wherein the non-volatile memory comprises magnetic random access memory (MRAM).

13. The memory system of claim 1, wherein the first controller further comprises a flash translation layer (FTL) for converting a logical address received from a host into a physical address of the memory device, wherein the first controller outputs the physical address to the second controller, and wherein the second controller controls the memory device based on the physical address.

14. A memory system comprising:
    a memory device;
    a first controller configured to output a control signal for the memory device and data to be stored in the memory device based on a signal received from a host;
    a second controller including a first memory interface configured to receive the data from the first controller and a second memory interface configured to output the data to the memory device; and
    a non-volatile memory configured to receive the data from the second controller and to store the data.

15. The memory system of claim 14, wherein the second controller further comprises a third memory interface electrically connected to the non-volatile memory.

16. The memory system of claim 14, wherein the first controller further comprises a memory interface electrically connected to the non-volatile memory.

17. A memory controller comprising:
    a first memory interface configured to receive a plurality of commands for a memory device and data to be stored in the memory device from a first controller;
    a second memory interface electrically connected to the memory device;
    a non-volatile memory for buffering the data; and
    a scheduler configured to output data stored in the non-volatile memory and the plurality of commands to the memory device through the second memory interface based on a set schedule,
    wherein the scheduler outputs metadata and the data to the memory device through the second memory interface based on a previously set schedule.

18. The memory controller of claim 17, further comprising a volatile memory, wherein the non-volatile memory generates the metadata for managing the data during the buffering, and wherein the volatile memory stores the metadata.

19. The memory controller of claim 17, wherein data read from the memory device is received through the second memory interface, and wherein the read data is output to the first controller through the first memory interface.

* * * * *